United States Patent
Dono et al.

(10) Patent No.: US 7,082,072 B2
(45) Date of Patent: Jul. 25, 2006

(54) SEMICONDUCTOR MEMORY DEVICE WITH REFRESHMENT CONTROL

(75) Inventors: Chiaki Dono, Tokyo (JP); Yasuji Koshikawa, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/997,320

(22) Filed: Nov. 24, 2004

(65) Prior Publication Data

US 2005/0111282 A1   May 26, 2005

(30) Foreign Application Priority Data

Nov. 26, 2003   (JP) ............................. 2003-395837

(51) Int. Cl.
*G11C 7/00*   (2006.01)
(52) U.S. Cl. .................. 365/222; 365/230.03
(58) Field of Classification Search ................ 365/222, 365/230.03
See application file for complete search history.

(56) References Cited

U.S. PATENT DOCUMENTS

| | | | | |
|---|---|---|---|---|
| 6,529,433 B1 * | 3/2003 | Choi | ........................... | 365/222 |
| 6,560,153 B1 * | 5/2003 | Mizugaki | ..................... | 365/222 |
| 6,807,121 B1 | 10/2004 | Natsui et al. | ................ | 365/222 |
| 6,847,566 B1 * | 1/2005 | Han et al. | ..................... | 365/203 |
| 6,894,942 B1 * | 5/2005 | Cho | ............................ | 365/222 |

FOREIGN PATENT DOCUMENTS

| | | |
|---|---|---|
| JP | 05-314766 | 11/1993 |
| JP | 09-063266 | 3/1997 |
| JP | 10-222977 | 8/1998 |
| JP | 2000-353383 | 12/2000 |

* cited by examiner

*Primary Examiner*—Michael Tran
(74) *Attorney, Agent, or Firm*—Hayes Soloway P.C.

(57) ABSTRACT

A semiconductor memory device includes a pair of memory sub arrays and a control signal generating circuit. The pair of memory sub arrays shares a sense amplifier, and each of the pair of memory sub arrays has a plurality of memory cells arranged in a matrix. Each of columns of the matrix is connected to a pair of bit lines, and each of rows of the matrix is connected to a word line. The control signal generating circuit sequentially outputs first and second refresh start signals within an operation time to an external refresh command in response to an internal refresh command. A first refreshing operation is carried out to first memory cells connected to a first word line of one of the memory sub arrays in response to the first refresh start signal, and a second refreshing operation is carried out to second memory cells connected to a second word line different from the first word line in the memory sub array in response to the second refresh start signal.

17 Claims, 14 Drawing Sheets

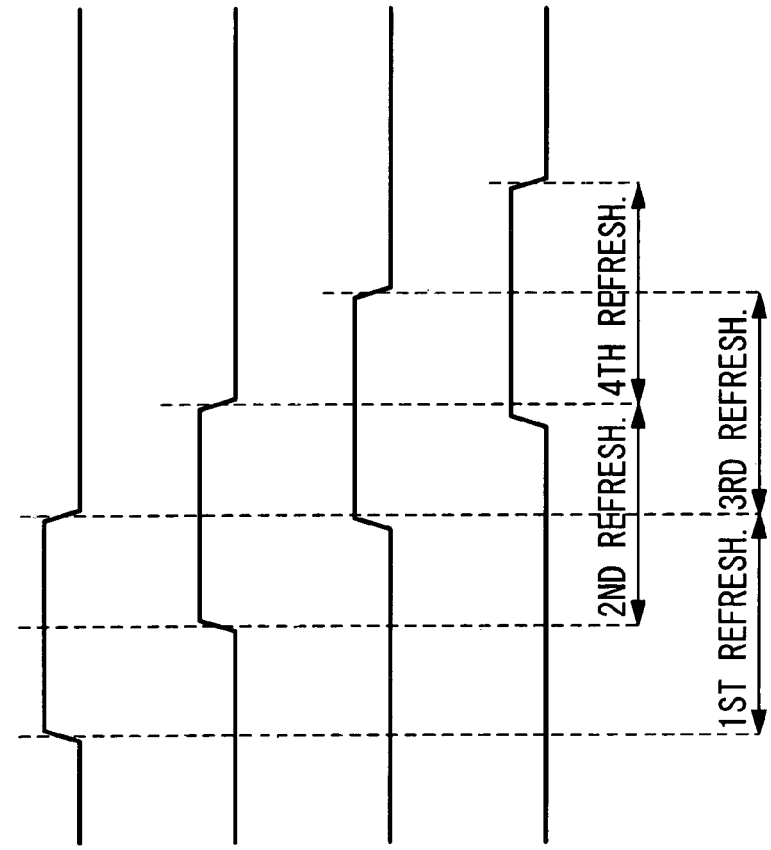

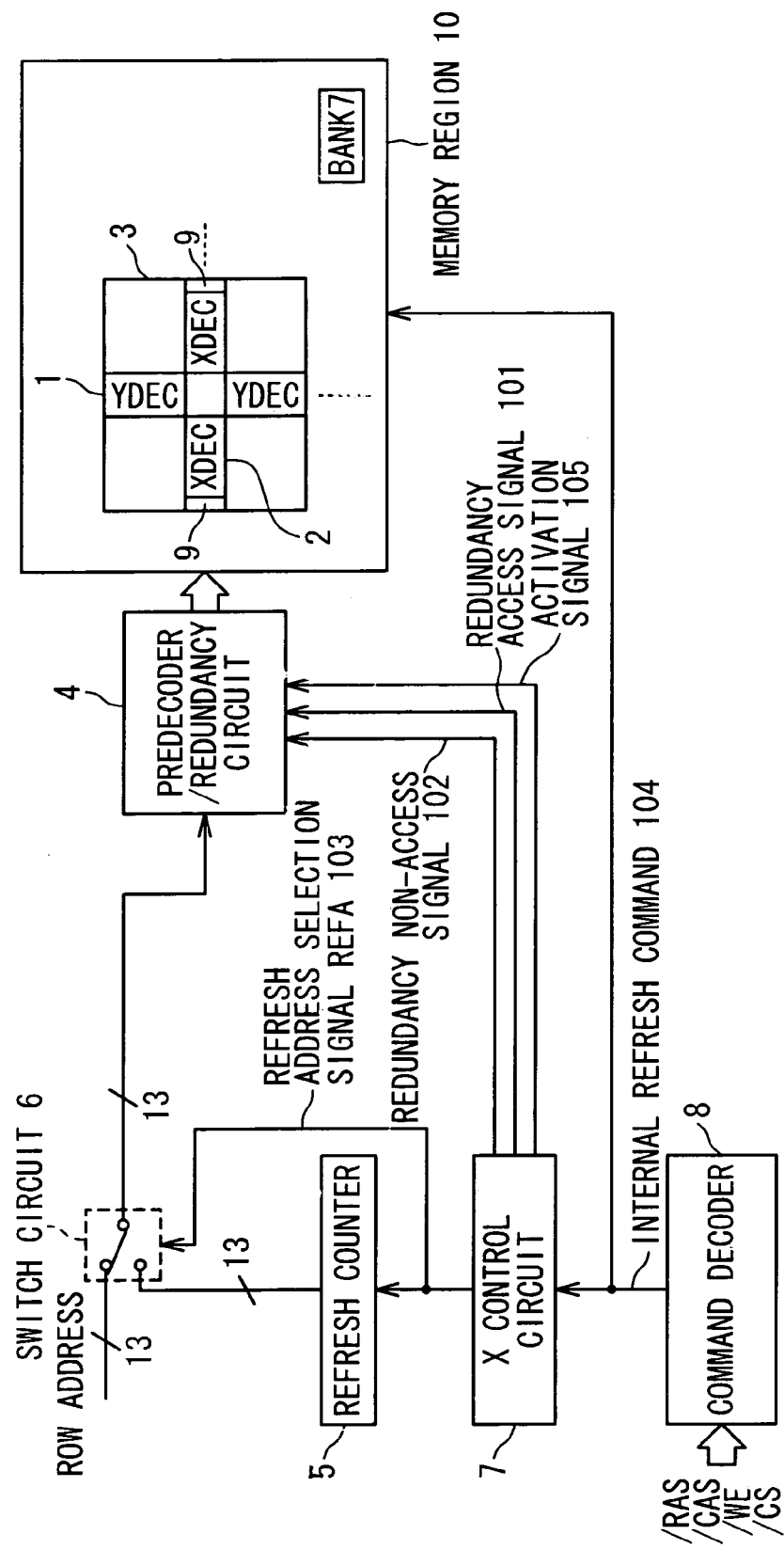

REGION ACTIVATED IN 1ST REFRESHMENT

REGION ACTIVATED IN 2ND REFRESHMENT

SEMICONDUCTOR MEMORY DEVICE WITH REFRESHMENT CONTROL

BACKGROUND OF THE INVENTION

1. Field of the Invention

The present invention relates to a semiconductor memory device and in particular to a refreshing technique in a semiconductor memory device.

2. Description of the Related Art

There has been much progress recently in increasing the memory capacity and miniaturization in semiconductor memory devices such as DRAM. Thus, the number of memory cells to be refreshed is also increasing with the increase in the memory capacity. The refreshing operation is carried out in response to a refresh command, and a time period between the refresh commands is defined by tRFC (hereinafter, referred to as "refresh command time"). When the memory capacity is increased while keeping the refresh command time tRFC to constant, the number of memory cells to be refreshed per unit time increases, resulting in increase in peak current consumption. For this reason, the specification of DRAM have been standardized in such a manner that the refresh command time tRFC is relaxed to reduce the number of memory cells to be refreshed per unit time and to suppress the increase in current consumption, with increase in the memory capacity.

In the generation of 1 G bit-DDR-I/II, mobile terminals and products on which a large capacity memory system is mounted occupy a more important position in the DRAM market. Accordingly, the technique for further reducing the current consumption becomes more important in such a product.

Next, a conventional refreshing operation will be described. FIGS. 2A to 2D are diagrams showing a memory cell region of a conventional semiconductor memory device to which a refreshing operation is carried out. In the conventional semiconductor memory device, the memory cell region has eight banks (BANKs 0 to 7), and each bank has four blocks. A Y decoder YDEC for bit line selection is arranged between the right block and the left block in the bank. A sub amplifier and an X decoder XDEC for word line selection are arranged between the upper block and the lower block in the bank. Each block has 8×24 memory sub arrays ARY. Two memory sub arrays ARY adjacent in the left and right direction shares a sense amplifier AMP and an equalizer EQ through a switching circuit having shared MOS transistors.

When a clock enable signal CKE, a chip select signal /CS, a row address strobe signal /RAS, a column address strobe signal /CAS, and a write enable signal /WE are inputted, the semiconductor memory device recognizes a combination of these signals as an external refresh command REF and carries out a refreshing operation.

The refresh period of the external refresh command REF is a period from T1 to Tn shown in FIG. 1A. Referring to FIGS. 1B to 1E, a refreshing operation to objective banks is carried out in response to the external refresh commands REF. First, as shown in FIG. 2A, the refreshing operation is carried out to BANKs 0 and 4 as the objective banks at timing T1. At this time, the refreshing operation is carried out on 16 memory sub arrays in the blocks adjacent in an upper and down direction in the objective banks, as shown on the right side of FIG. 2A. Subsequently, as shown in FIG. 2B, the refreshing operation is carried out to BANKs 1 and 5 as the objective banks at timing t3. At this time, the refreshing operation is carried out on 16 memory sub arrays in the blocks adjacent in an upper and down direction in the objective banks, as shown on the right side of FIG. 2B. Subsequently, as shown in FIG. 2C, the refreshing operation is carried out to BANKs 2 and 6 as the objective banks at timing T5. At this time, the refreshing operation is carried out on 16 memory sub arrays in the blocks adjacent in an upper and down direction in the objective banks, as shown on the right side of FIG. 2C. Also, the refreshing operation of the BANKs 0 and 4 is completed. Subsequently, as shown in FIG. 2D, the refreshing operation is carried out to BANKs 3 and 7 as the objective banks at timing T7. At this time, the refreshing operation is carried out on 16 memory sub arrays in the blocks adjacent in an upper and down direction in the objective banks, as shown on the right side of FIG. 2D. Also, the refreshing operation of the BANKs 1 and 5 is completed. At timing Tn, the refreshing operation to BANKs 3 and 7 is completed. In this way, in the conventional semiconductor memory device, the refreshing operation is carried out in a time divisional manner, in order to reduce consumption current. The number of memory sub arrays to be refreshed at the same time is 64 (=16×4).

Next, the refreshing operation to each bank will be described below in detail. FIGS. 3B to 3F corresponds to the refreshing operation of the BANKs 0 and 4, FIGS. 3G to 3K corresponds to the refreshing operation of the BANKs 1 and 5, FIGS. 3L to 3O corresponds to the refreshing operation of the BANKs 2 and 6, and FIGS. 3P to 3T corresponds to the refreshing operation of the BANKs 3 and 7. Since all the refreshing operations are identical except the refresh start timing, only the refreshing operation to the BANKs 0 and 4 shown in FIGS. 3B to 3F will be described.

First, the potentials of a connection control signal SHR1T and an equalizer control signal BLEQT are changed from a potential VPP to a potential VSS, to turn off the two shared MOS transistors and an equalizing circuit EQ for equalizing the potentials of bit lines in an inactivated sub memory array (sub memory array containing no memory cells to be refreshed) side of the BANK. At this time, because the two shared MOS transistors in the activated sub memory side are turned on, a connection control signal SHR0T continues to have the potential VPP. Next, a word line selection signal MWLB <0> and a sub word line selection signal FXB <0> are selected by the X decoder, and the potentials thereof are changed from the potential VPP to the potential VSS. As a result, the potential of a word line SWLT <0> is changed from the potential VSS to the potential VPP. In this way, when data from one of the memory cells MC is read out on bit lines BL0T/B, the potential of a sense amplifier control signal SAET is changed from the potential VSS to the potential VCL, to start to amplify the data on the bit lines. After the data on the bit line is amplified sufficiently and rewritten into the memory cell, the potential of a sense amplifier control signal SAET is changed from the potential VCL to the potential VSS, to complete the amplifying operation. Subsequently, the potentials of the equalizer control signal BLEQT and the sub word line selection signal FXB <0> are changed from the potential VSS to the potential VPP, to complete the rewriting operation into the memory cells. Thus, the first refreshing operation is completed. The other BANKs are refreshed in a time divisional manner and the refreshing operations thereof are started one after another. The operations are the same as that described above, and the description is omitted.

As described above, for reduction of current consumption, the circuit has been designed so that the memory sub arrays are refreshed in the time divisional manner to reduce the peak current consumption. However, the method cannot reduce the average current consumption.

In conjunction with the above description, a semiconductor memory device is disclosed in Japanese Laid Open Patent Application (JP-A-Heisei 5-314766). The semiconductor memory device in this conventional example includes a shared sense amplifier which is connected with two pairs of bit lines and a switching transistor interposed in each of the bit lines of the two pairs. The shared sense amplifier is connected to one of the two pairs of bit lines by switching of the switching transistor. Memory cells on two word lines which cross the connected pair of bit lines are refreshed continuously in units of word lines one after another in a /CAS before /RAS refresh mode and a self refresh mode. During this operation, the signal level of a bit line selection signal supplied to the gate of the switching transistor corresponding to the connected pair of bit lines is kept constant. Also, a semiconductor memory device is disclosed in Japanese Laid Open Patent Application (JP-A-Heisei 9-63266). The semiconductor memory device in this conventional example has a normal operation mode and a self refresh mode with an operation speed slower than that the normal operation mode. In the semiconductor memory device in this conventional example, a sense amplifier is connected with first and second sense nodes, and amplifies a potential difference generated between the first and second sense nodes. A first bit line pair is arranged on one side of the sense amplifier, and a second bit line pair is arranged on the other side of the sense amplifier. A plurality of the word lines cross the first and second bit line pairs. A row decoder selectively activates one of the word lines based on a row address signal. First switches are connected between the first and second sense nodes and the bit lines of the first pair, and second switches are connected between the first and second sense nodes and the bit lines of the second pair. A control unit controls the first and the second switches so that one current of the first and second bit line pairs is connected to the sense amplifier in the normal operation mode, and so that one of the first and the second bit line pairs is connected to the sense amplifier, the connected bit line pair connected is disconnected from the sense amplifier after data is read out on the bit lines of the connected pair, and then the disconnected pair of bit lines is reconnected to the sense amplifier after the sense amplifier is activated, in the self refresh mode. The power consumption in the self refresh mode is reduced in the conventional semiconductor memory device.

Also, a semiconductor memory device is disclosed in Japanese Laid Open Patent Application (JP-A-Heisei 10-222977). The semiconductor memory device in this conventional example has a plurality of memory blocks and a gate circuit connected between each of the memory blocks and one of the shared bit line sense amplifiers. A refresh row active signal that is activated in a certain interval is generated, and a plurality of block selection signals are generated to be selectively activated when the refresh row active signal is active. A latch switching control signal is generated, which is set by each of corresponding block selection signals and is reset by a block selection signal corresponding to the memory block to be next refreshed. When the latch switching control signal is active, the corresponding gate circuit is turned on and another gate circuit connected to the same bit line sense amplifier is turned off. During a block refresh cycle, the turn-on state or turn-off state of the gate circuit is kept constant. In this manner, the power consumption is reduced.

Also, a dynamic semiconductor memory device is disclosed in Japanese Laid Open Patent Application (JP-P2000-353383A). The dynamic semiconductor memory device in this conventional example includes a plurality of banks composed of a plurality of sub arrays. A sense amplifier circuit is shared by the different sub arrays in the banks. The memory cell array has the plurality of banks and the sense amplifier circuits. The dynamic semiconductor memory device in this conventional example has a row access mode for activating selected sub arrays in each bank for reading or writing data, and a refresh mode for activating a plurality of sub arrays in each bank at the same time and refreshing the memory cell data. In a control circuit, the number of sub arrays activated a same timing in the bank in the refresh mode is greater than the number of the sub arrays activated in the bank in the row access mode. According to the conventional dynamic semiconductor memory device, the probability of operational restriction is reduced to enable high-speed operation and DRAM of a non-independent bank type is provided.

SUMMARY OF THE INVENTION

An object of the present invention is to provide a semiconductor memory device in which a refreshing operation is carried out twice within a period of refresh command time tRFC.

Another object of the present invention is to provide a semiconductor memory device in which first memory cells different from second memory cells refreshed by a first refreshing operation and arranged in a same memory sub array as the second memory cells are refreshed by a second refreshing operation.

Another object of the present invention is to provide a semiconductor memory device in which peak current consumption is reduced and average current consumption can be reduced.

Another object of the present invention is to provide a semiconductor memory device in which peak consumption current is reduced and average consumption current can be reduced.

ABSTRACT OF THE DISCLOSURE

In an aspect of the present invention, a semiconductor memory device includes a pair of memory sub arrays and a control signal generating circuit. The pair of memory sub arrays shares a sense amplifier, and each of the pair of memory sub arrays has a plurality of memory cells arranged in a matrix. Each of columns of the matrix is connected to a pair of bit lines, and each of rows of the matrix is connected to a word line. The control signal generating circuit sequentially outputs first and second refresh start signals within an operation time to an external refresh command in response to an internal refresh command. A first refreshing operation is carried out to first memory cells connected to a first word line of one of the memory sub arrays in response to the first refresh start signal, and a second refreshing operation is carried out to second memory cells connected to a second word line different from the first word line in the memory sub array in response to the second refresh start signal.

Here, the pair of memory sub arrays may further include first and second switching circuits and an equalizer. The first and second switching circuits are provided between the memory sub array and the sense amplifier to operate in response to first and second connection control signals, respectively. The equalizer is provided between the first and second switching circuits. The control signal generating circuit outputs first and second sense amplifier control signals in response to the first and second refresh start signals, respectively, generates an equalizer control signal between the first and second sense amplifier control signals, and generates the first and second connection control signals to connect the memory sub array to the sense amplifier and the equalizer by the first switching circuit, and to disconnect the other memory sub array from the sense amplifier and the equalizer. The sense amplifier is activated in response to each of the first and second sense amplifier control signals, and the equalizer is activated in response to the equalizer control signal.

In this case, the semiconductor memory device may further include an X decoder which outputs a first main word line selection signal and a first sub word line selection signal from first and second refresh addresses respectively supplied in response to the first and second refresh start signals to specify the first word line and a second main word line selection signal and a second sub word line selection signals from the first and second refresh addresses to specify the second word line. The first and second main word line selection signals are same and the first and second sub word line selection signals are different from each other in the first and second refreshing operations. Alternately, the first and second main word line selection signals may be different from each other and the first and second sub word line selection signals are same in the first and second refreshing operations.

In another aspect of the present invention, a semiconductor memory device includes a memory region having a plurality of banks and a control signal generating circuit. The control signal generating circuit sequentially outputs first and second refresh start signals in response to an internal refresh command. Each of the plurality of banks has a plurality of blocks, each of the plurality of blocks has a plurality of memory sub arrays, each of the plurality of the memory sub arrays has a plurality of memory cells arranged in a matrix, each of columns of the plurality of memory cells is connected to a pair of bit lines, and each of rows of the plurality of memory cells is connected to a word line. The plurality of blocks in each of the plurality of banks are grouped into a plurality of block groups. A refreshing operation is sequentially carried out to the plurality of memory sub arrays in each of the plurality of block groups of each of the plurality of banks based on the internal refresh command while changing a refresh address in response to each of the first and second refresh start signals to specify the memory cells to be refreshed, and then the refreshing operation is sequentially carried out to the plurality of memory sub arrays of remaining block groups.

In this case, the plurality of banks may be grouped into a plurality of bank groups. A start timing of the refreshing operation carried out in response to each of the first and second refresh start signals is different among the plurality of bank groups.

In this case, the control signal generating circuit sequentially outputs the first and second refresh start signals within a refreshing operation time corresponding to the internal refresh command. The refreshing operation carried out to a specific one of the plurality of memory sub arrays of each of the plurality of block groups in response to the first refresh start signal and the refreshing operation carried out to the specific memory sub array in response to the second refresh start signal within the refreshing operation time of the internal refresh command.

Also, the plurality of memory sub arrays form a plurality of pairs. Each of the plurality of pairs includes a sense amplifier, first and second switching circuits and an equalizer. The first and second switching circuits are provided between one of the plurality of memory sub arrays and the sense amplifier to operate in response to first and second connection control signals. The equalizer is provided between the first and second switching circuits. The control signal generating circuit outputs first and second sense amplifier control signals in response to the first and second refresh start signals, respectively, generates an equalizer control signal between the first and second sense amplifier control signals, and generates the first and second connection control signals to connect the memory sub array to the sense amplifier and the equalizer by the first switching circuit, and to disconnect the other memory sub array from the sense amplifier and the equalizer. The sense amplifier is activated in response to each of the first and second sense amplifier control signals, and the equalizer is activated in response to the equalizer control signal.

The semiconductor memory device may further include an X decoder which outputs a first main word line selection signal and a first sub word line selection signal from first and second refresh addresses respectively supplied in response to the first and second refresh start signals to specify the first word line and a second main word line selection signal and a second sub word line selection signals from the first and second refresh addresses to specify the second word line. The first and second main word line selection signals may be same and the first and second sub word line selection signals may be different from each other in the first and second refreshing operations. Alternately, the first and second main word line selection signals may be different from each other and the first and second sub word line selection signals may be same in the first and second refreshing operations.

Another feature included in the semiconductor memory device is two memory sub arrays and a start control signal generating circuit. The two memory sub arrays sharing a sense amplifier, the two memory sub arrays have a plurality of memory cells arranged in a matrix, and each of a plurality of the memory cells is specified by first and the second word line selection signals. The start control signal generating circuit generates the first and second refresh start signals in response to a single refresh command. A refreshing operation is carried out to a memory cell portion of the plurality of memory cells in one of the two memory sub arrays in response to the first refresh start signal, and the refreshing operation is carried out to another memory cell portion of the plurality of memory cells different from the memory cell portion in the memory sub array in response to the second refresh start signal.

In another aspect of the present invention, a semiconductor memory device includes a memory region. The memory region has a plurality of banks, and each of the plurality of banks has a plurality of blocks, and each of the plurality of blocks has a pair of memory sub arrays. The pair of memory sub arrays shares a sense amplifier, and each of the memory sub arrays has a plurality of memory cells arranged in a matrix. A refreshing operation is carried out to specific memory cells of a plurality of specific blocks of the plurality of blocks in each of the plurality of banks within a first refresh time of a refresh time corresponding to a single external refresh command, and the refreshing operation is carried out to memory cells different from the specific memory cells of the plurality of specific blocks within a second refresh time after the first refresh time of the refresh time.

In this case, the plurality of banks are grouped into a plurality of groups. A start timing of the refreshing operation to the plurality of specific blocks is different in units of groups.

BRIEF DESCRIPTION OF THE DRAWINGS

FIGS. 1A to 1E are timing charts showing a refreshing operation of a conventional semiconductor memory device;

FIG. 4 is a block diagram showing a configuration of a semiconductor memory device according to a first embodiment of the present invention;

DESCRIPTION OF THE PREFERRED EMBODIMENTS

Figure 2A:
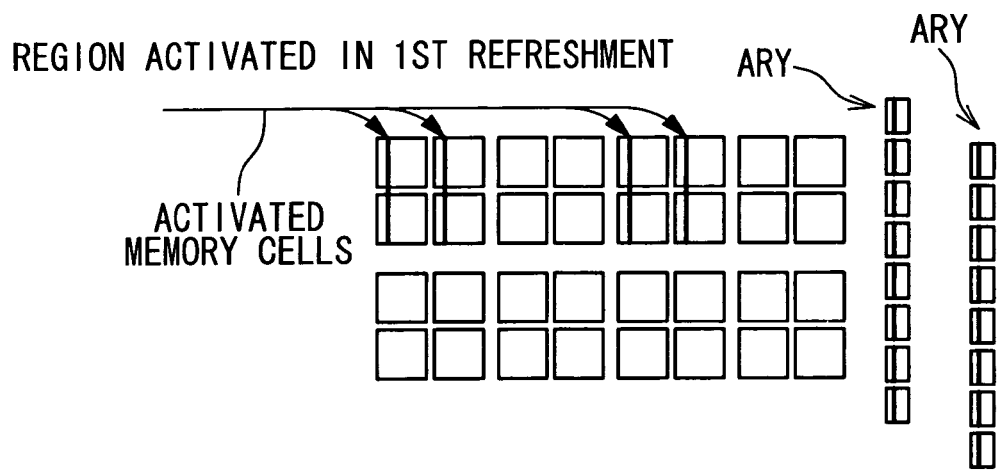
FIGS. 2A to 2D are diagrams showing an order of the refreshing operation of the conventional semiconductor memory device.
Figure 2B:
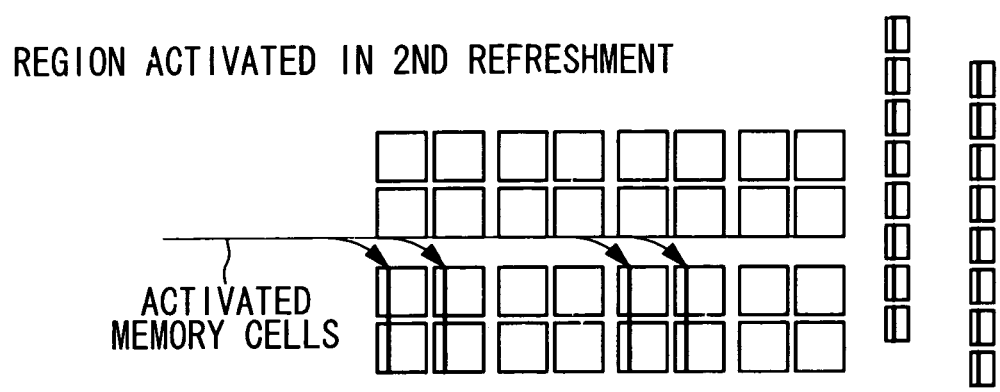
Figure 2C:
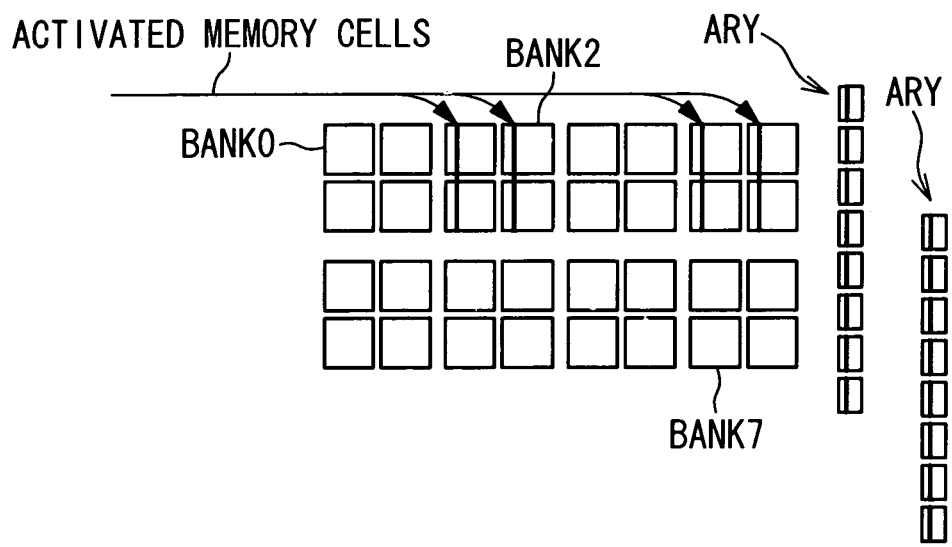
Figure 2D:
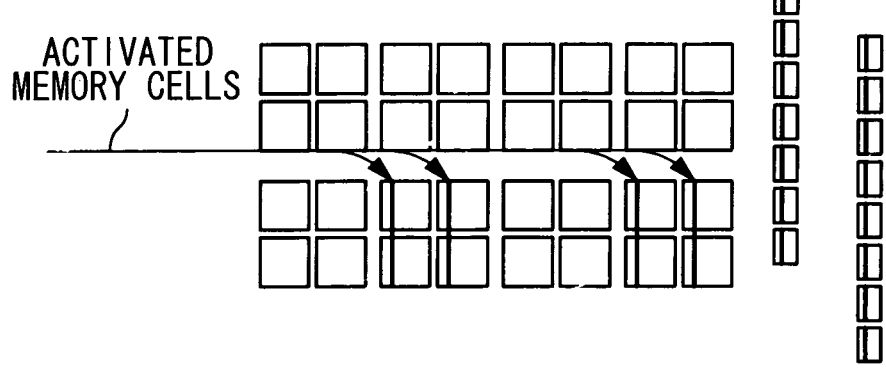
Figure 3:
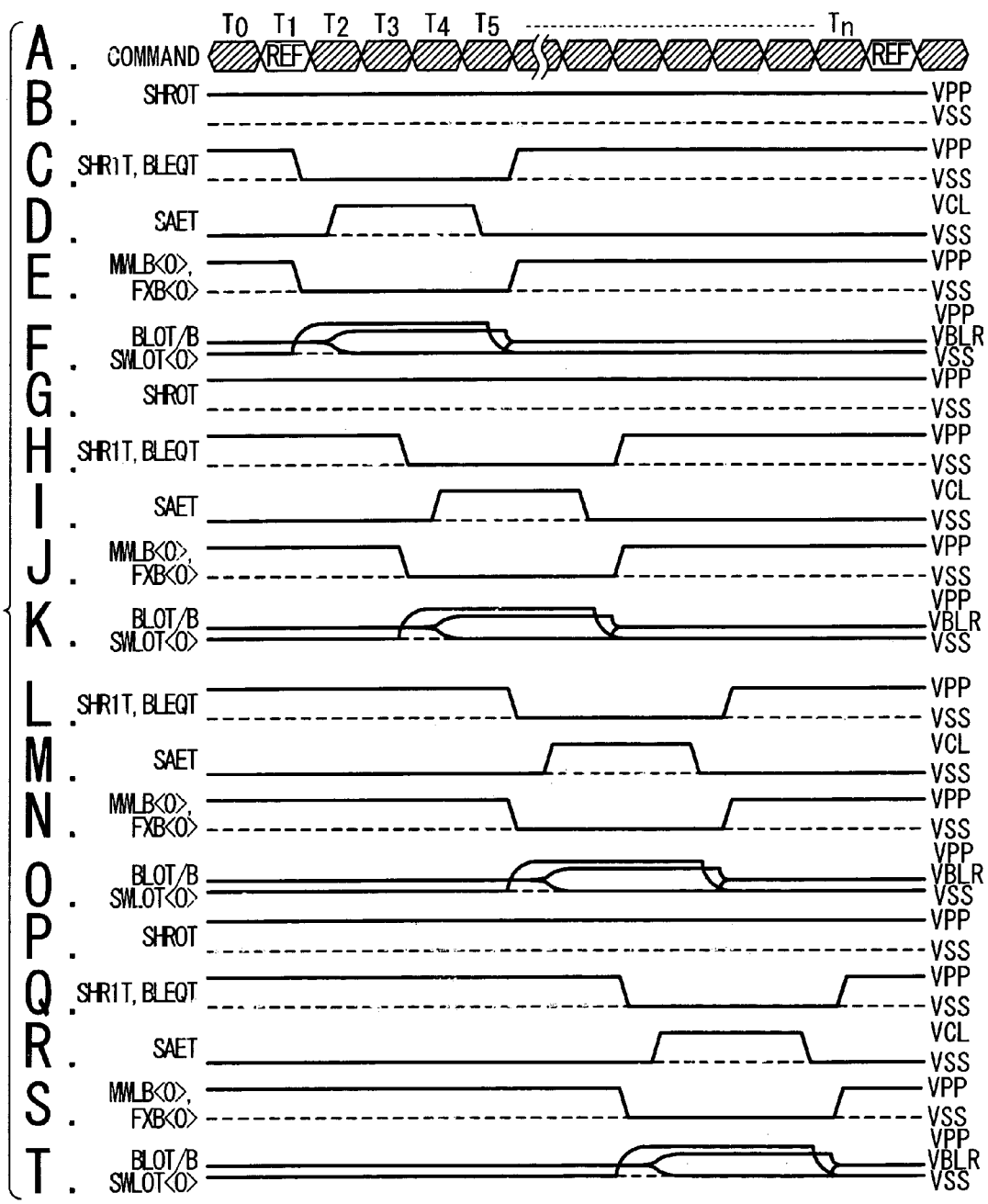
FIGS. 3A to 3T are timing charts showing an operation of the conventional semiconductor memory device.

Hereinafter, the semiconductor memory device according to the present invention will be described in detail with reference to the attached drawings.

First Embodiment

FIG. 4 is a block diagram showing the configuration of the semiconductor memory device according to the first embodiment of the present invention. The semiconductor memory device according to the embodiment includes a predecoder/redundancy circuit 4, a refresh counter 5, a switch circuit 6, an X control circuit 7, a command decoder 8, and a memory region 10. In the first embodiment, the memory region 10 has the same configuration as described with reference to FIG. 2. Namely, the memory region 10 has eight BANKs 0 to 7. Each bank includes four blocks 3, a Y decoder YDEC 1, an X decoder XDEC 2, memory cell arrays containing memory sub arrays, and a control signal generating circuit 9. The Y decoder YDEC 1 is arranged between two blocks 3 adjacent in a left and right direction to select a pair of bit lines. The X decoder XDEC 2 for word line selection, the control signal generating circuit 9, and an amplifier (not shown) for amplification of input/output data are arranged between two block 3 adjacent in the up and down directions. Each block has 8×24 memory sub arrays ARY. Every two memory sub arrays ARY form a pair.

It should be noted that this configuration of the memory region 10 is only an example. The numbers of banks in the memory region 10, the number of blocks in the bank and the number of memory sub arrays in the block are not limited to the example. The present invention can be applied to semiconductor memory devices with various configurations.

Figure 6:
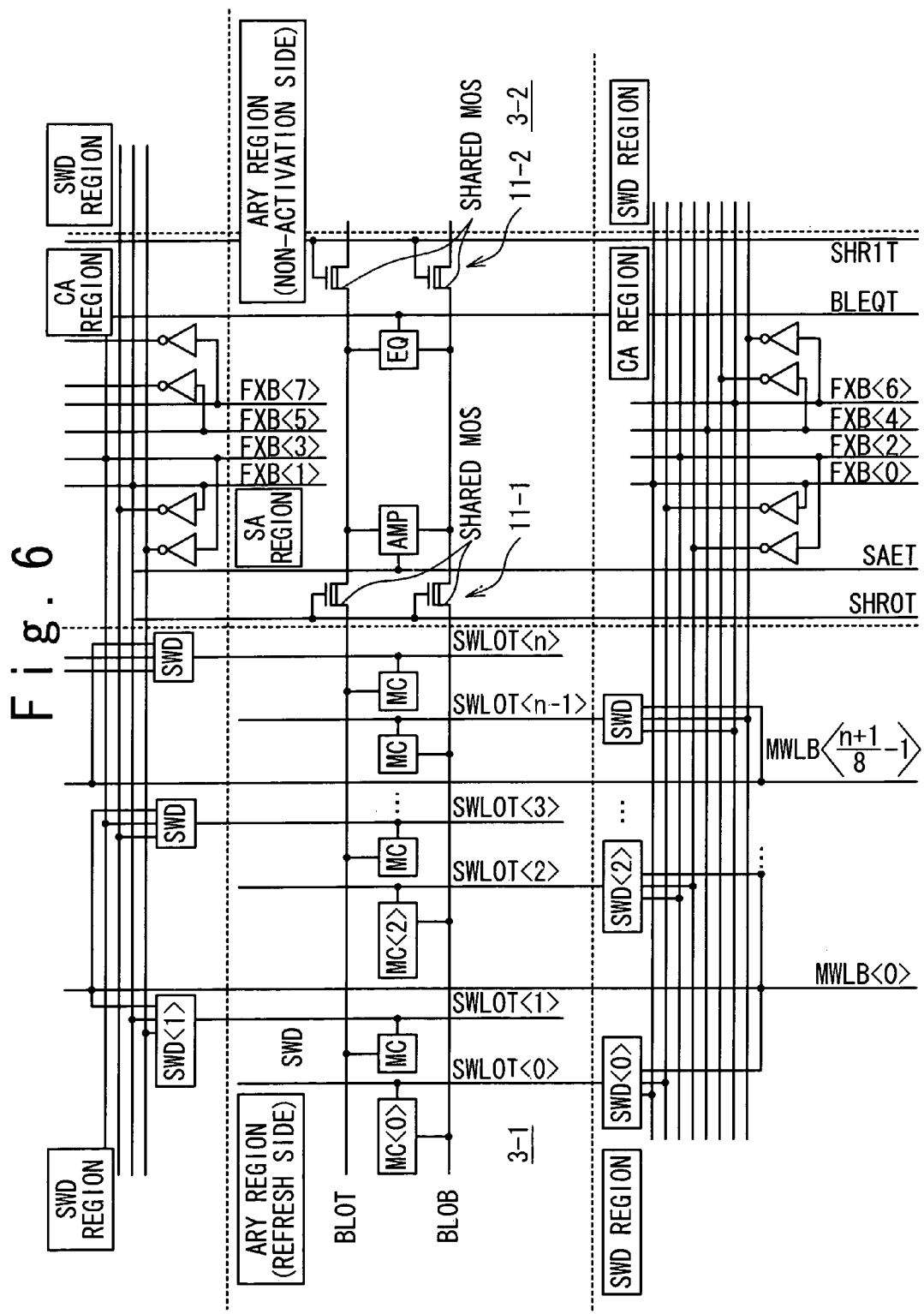
FIG. 6 is a chart showing a configuration of a memory sub arrays in a semiconductor memory device according to the first embodiment of the present invention.

FIG. 6 is a diagram showing the configuration of a part of one pair of memory sub arrays in each block. In FIG. 6, it is supposed that the memory sub array 3-1 on the left side is activated (refreshed), and the memory sub array 3-2 on the right side is inactivated. Memory cells MC are arranged in a matrix in each memory sub array ARY. In FIG. 6, only a pair of bit lines BL0T and BL0B are shown. A sense amplifier AMP and an equalizer EQ are arranged between the memory sub arrays. A switching circuit 11-1 is arranged to have a shared MOS transistor on each bit line between the sense amplifier AMP and the memory sub array 3-1. A switching circuit 11-2 is arranged to have a shared MOS transistor on each bit line between the equalizer EQ and the memory sub array 3-2. The sense amplifier AMP is activated in response to a sense amplifier control signal SAET, and the equalizer EQ is activated in response to an equalizer control signal BLEQT. A connection control signal SHR0T is supplied to a pair of the shared MOS transistors of the switching circuit 11-1 for the pair of bit lines BL0T and BL0B such that the memory sub array 3-1 is connected to the sense amplifier AMP and the equalizer EQ. Also, a connection control signal SHR1T is supplied to a pair of the shared MOS transistors of the switching circuit 11-2 for the pair of bit lines such that the memory sub array 3-2 is connected to the sense amplifier AMP and the equalizer EQ.

Main word line selection signals MWLB <0> to <(n+1)/8−1> are supplied to the memory sub array ARY 3-1. Buses are provided in sub word drive (SWD) regions arranged on the both sides of the memory sub arrays. Sub word line selection signals FXB <0>, <2>, <4>, and <6> and sub word line selection signals FXB <1>, <3>, <5>, and <7> are supplied to a sense amplifier regions SA where the sense amplifier AMP, the equalizer EQ and the switching circuits 11-1 and 11-2 are provided. The sub word line selection signals FXB <0>, <2>, <4>, and <6> are connected to the respective lines in one of the buses directly or through inverters. The sub word line selection signals FXB <1>, <3>, <5>, and <7> are connected to the respective lines in the other of the buses directly or through inverters.

Eight sub word drivers SWD are provided for each main word line selection signal MWLB. For example, a sub word driver SWD <0> is connected to the corresponding word line selection signal MWLB <0> and the bus line connected to the corresponding sub word line selection signal FXB <0>, and activates the word line SWL0T. Each memory cell in the memory sub array is connected to the corresponding word line SWL0T and the corresponding bit line BL0T or BL0B.

Referring to FIG. 4 again, the command decoder 8 inputs control signals such as a column address strobe signal /CAS, a row address strobe signal /RAS, a write enable signal /WE, and a chip select signal /CS and generates commands for control of read/write operations and a refreshing operation to the memory region 10. The description of the operations other than the refreshing operation is omitted, because the operations do not directly relate with the present invention. The command decoder 8 receives a combination of the above signals as an external refresh command and generates an internal refresh command REF. The command decoder 8 outputs the internal refresh command REF to the X control circuit 7 and the control signal generating circuit 9.

The X control circuit 7 generates and outputs control signals for controlling each circuit section of the semiconductor memory device based on the commands supplied from the command decoder 8. However, because the present invention relates to the refreshing operation, only signals related to the refreshing operation will be described below. Specifically, the X control circuit 7 generates and outputs a refresh address selection signal REFA 103 indicative of the start of the refreshing operation in response to an internal refresh command REF 104 supplied from the command decoder 8. The X control circuit 7 also outputs a redundancy non-access signal 102 to inhibit replacement with a redundant word line when the memory cells connected with normal word lines are refreshed. On the other hand, The X control circuit 7 outputs a redundancy access signal 101 to inhibit the activation of the normal word lines when redundant memory cells connected with redundant word lines are refreshed. In addition, the X control circuit 7 outputs an activation signal 105 when any word line is activated.

Each time the refresh address selection signal REFA 103 is received from the X control circuit 7, the refresh counter 5 counts up and generates and outputs a refresh address for selecting the normal word line in each memory sub array. After generating the refresh addresses for all the normal word lines, the refresh counter 5 generates and outputs refresh address for selecting one of the redundant word lines belonging to the same sub array each time the refresh address selection signal REFA 103 is inputted. Specifically, in this embodiment, each time receiving the refresh address selection signal REFA 103, the refresh counter 5 sequentially generates and outputs the addresses for selecting the normal word lines and then sequentially generates and outputs the addresses for selecting the redundant word lines.

The switch circuit 6 outputs an external row address to the predecoder/redundancy circuit 4 in case of a normal operation, and outputs the refresh address generated by the refresh counter 5 to the predecoder/redundancy circuit 4 in response to the refresh address selection signal REFA 103 from the X control circuit 7 in case of the refreshing operation.

The predecoder/redundancy circuit 4 predecodes a portion of the row address (X address) supplied from the switch circuit 6 and outputs a bank selection signal for selecting one or more of the banks. Also, the predecoder/redundancy circuit 4 supplies the other portion of the address to respective banks. In addition, the predecoder/redundancy circuit 4 receives the redundancy non-access signal 102 for inhibiting replacement by the redundant word line, the redundancy access 101 for permitting the replacement by the redundant word line, and the activation signal 105. Also, the predecoder/redundancy circuit 4 sets a normal word line selection signal to a high level for permitting selection of the normal word lines in case of the redundancy non-access signal 102 of the high level and instructs activation of the normal word line specified by the supplied address. In addition, the predecoder/redundancy circuit 4 sets a redundancy word line selection signal to the high level for permitting selection of the redundancy word lines in case of the redundancy access signal 101 of the high level and instructs activation of the redundancy word line specified by the supplied address.

The Y decoder YDEC 1 selects a pair of bit lines specified based on a column address (Y address) in the normal operation. Alternatively, the Y decoder YDEC 1 activates the Y addresses in the refreshing operation. The X decoder XDEC 2 decodes an X address (refresh address) supplied from the predecoder/redundancy circuit 4 and generates a main word line selection signal MWLB and a sub word line selection signal FXB. When the redundancy word line selection signal 106 from the predecoder/redundancy circuit 4 is in the high level, the X decoder XDEC 2 activates the redundant word lines based on the refresh address.

Figure 7:
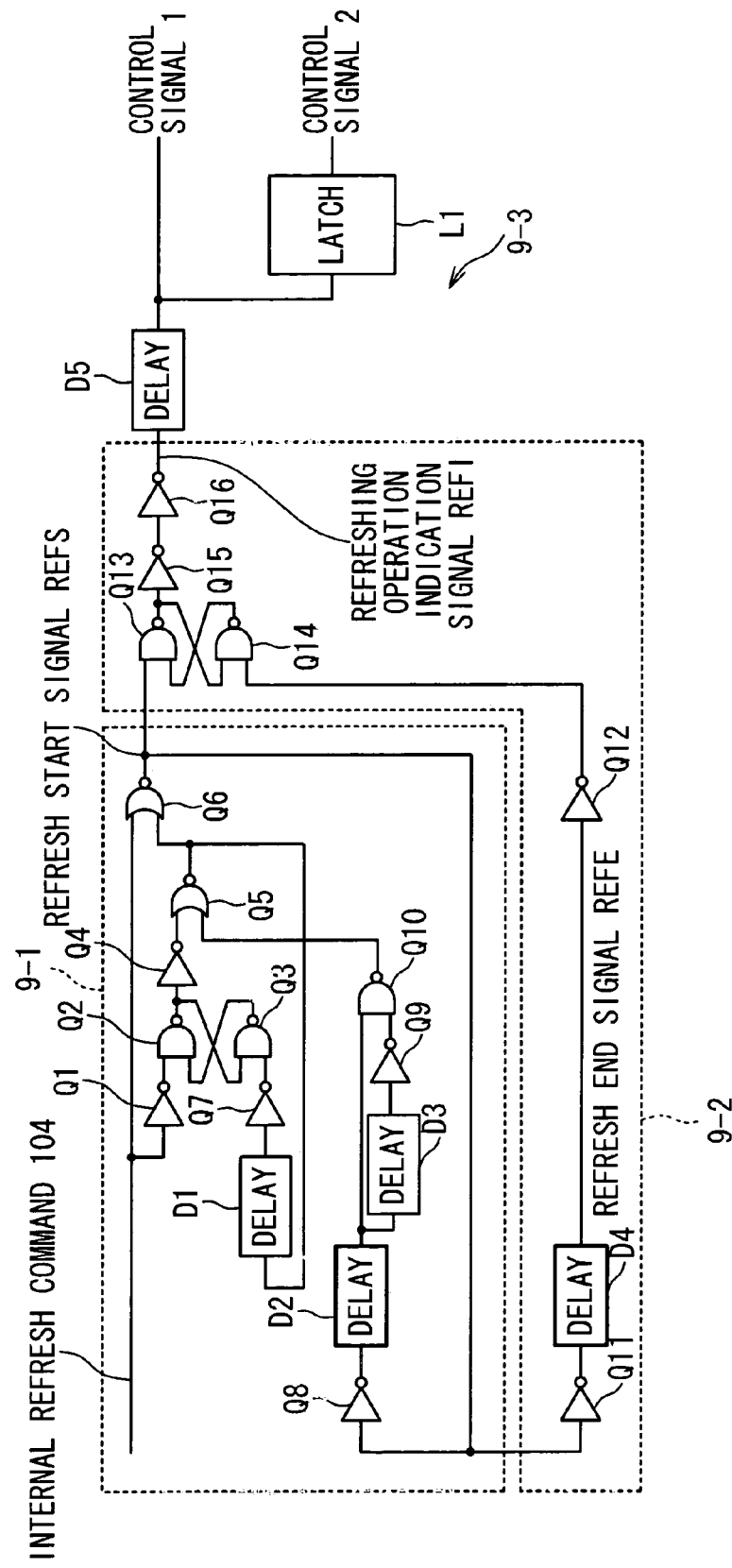
FIG. 7 is a block diagram showing a configuration of a control signal generating circuit in the semiconductor memory device according to the first embodiment of the present invention.

The control signal generating circuit 9 is arranged close to the X decoder 2. Referring to FIG. 7, the control signal generating circuit 9 has circuit sections 9-1 to 9-3. The circuit section 9-1 generates a refresh start signal REFS twice from the internal refresh command. The circuit section 9-2 generates a refresh end signal REFE from each refresh start signal REFS, and outputs a refreshing operation indication signal REFI. The circuit section 9-3 generates control signals 1 and 2 from the refreshing operation indication signal REFI. The control signal generating circuit 9 further generates the sense amplifier control signal SAET and the equalizer control signal BLEQT from the control signal 1. In addition, the control signal generating circuit 9 generates the connection control signals SHR0T and SHR1T based on the control signal 2. In this way, in the first embodiment, the refresh start signal REFS is generated twice and the refreshing operation are carried out twice in the period corresponding to the single internal refresh command.

More specifically, in the circuit section 9-1, the first refresh start signal REFS is generated in response to the internal refresh command REF by a flip-flop of NAND circuits Q2 and Q3. The pulse width of the signal REFS is determined by a delay time of a delay circuit D1. The second refresh start signal REFS is generated by delay circuits D2 and D3, an inverter Q9, and a NAND circuit Q10. The timing of generation of the second refresh start signal REFS is determined by a delay time of the delay circuit D2. In the circuit section 9-2, the refresh end signal REFE is generated based on each of the first and second refresh start signals REFS by a delay circuit D4. The timing of generation of the refresh end signal REFE is determined based on a delay time of the delay circuit D4. The control signal 1 is generated based on the refreshing operation indication signal REFI indicative of the refresh start signal REFS and the refresh end signal REFE by a flip-flop of NAND circuits Q13 and Q14. In the circuit section 9-3, the control signal 1 is outputted as it is, and the control signal 2 is generated from the control signal 1 by a latch circuit L1. A delay circuit D5 may be provided on the input side of the circuit section 9-3. The function of the delay circuit D5 will be described later.

The delay time of the delay circuit D2 is equal to a sum of a time period (tRAS) during which a rewriting operation is carried out to a memory cell in the first refreshing operation and a time period (tRP) during which the bit lines BL0T/B are equalized to a same potential so that the sense amplifier becomes operable. The delay time of the delay circuit D4 is equal to tRAS.

Figure 8:
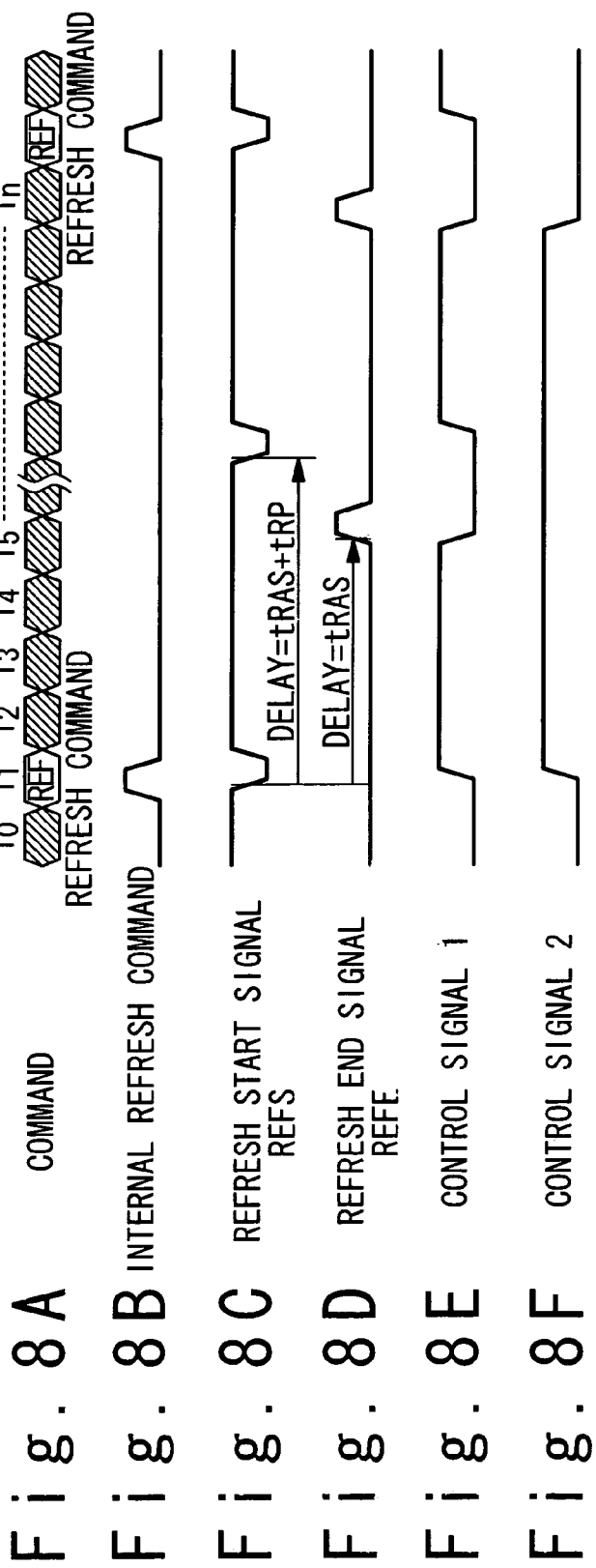
FIGS. 8A to 8F are timing charts showing an operation of the semiconductor memory device according to the first embodiment of the present invention.
Figure 9:
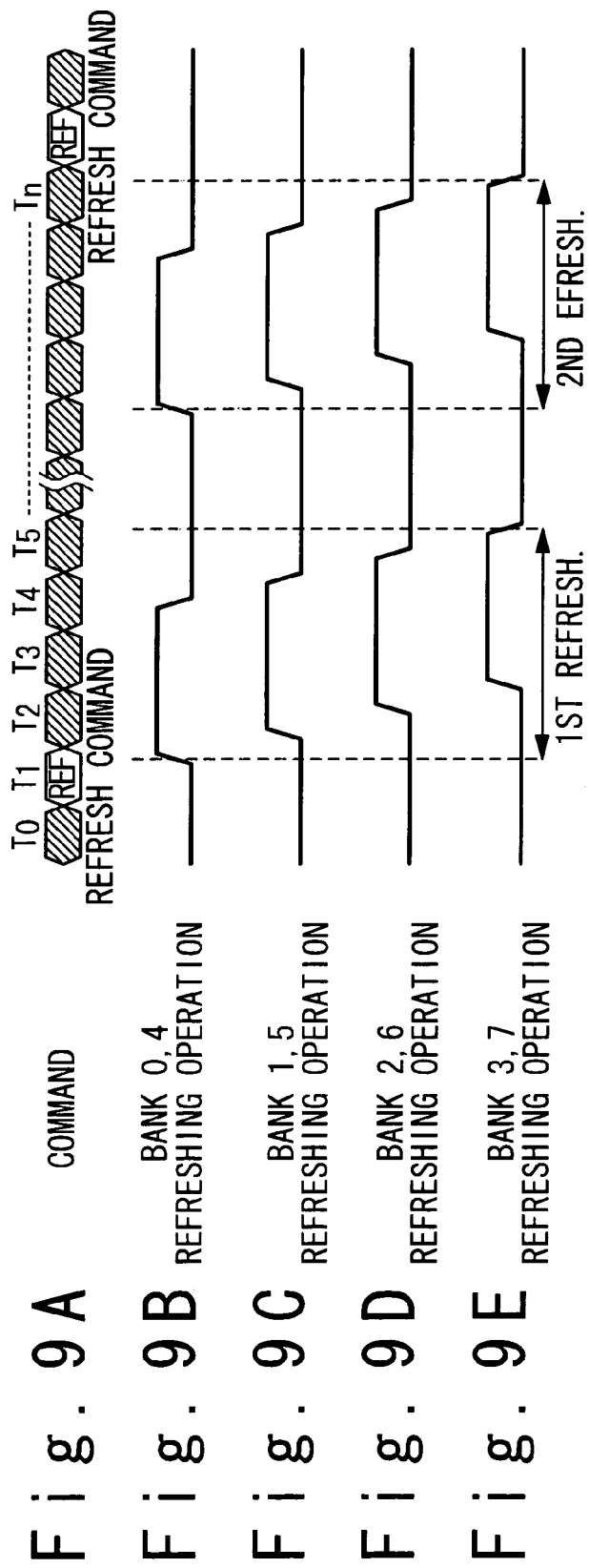
FIGS. 9A to 9E are timing charts showing the refreshing operation of the semiconductor memory device according to the first embodiment of the present invention.

Hereinafter, operations of the semiconductor memory device according to the first embodiment of the present invention will be described. As shown in FIG. 8B, the command decoder 8 generates the internal refresh command REF 104 in response to the external refresh command of FIG. 8A, and supplies the internal refresh command REF 104 to the X control circuit 7 and the control signal generating circuit 9 of each bank of the memory region 10. As shown in FIGS. 8C and 8D, the control signal generating circuit 9 generates the refresh start signals REFS twice and the refresh end signals REFE twice in response to the internal refresh command REF 104. The refreshing operation is carried out once between the refresh start signal REFS and the refresh end signal REFE. For this purpose, as shown in FIGS. 8E and 8F, the control signals 1 and 2 are generated in response to the refresh starts signal REFS and the refresh end signals REFE. The control signal generating circuit 9 generates the sense amplifier control signal SAET, the equalizer control signal BLEQT, and the connection control signals SHRT and SHR1T from the control signals 1 and 2.

The X control circuit 7 generates the refresh address selection signal REFA in response to the internal refresh command 104 and outputs the refresh address selection signal REFA to the refresh counter 5 and the switch circuit 6. At this time, the X control circuit 7 also generates the refresh address selection signal REFA twice in response to the single internal refresh command 104 in the same way as the control signal generating circuit 9. The refresh counter 5 counts the refresh address selection signal REFA and outputs a refresh address. The refresh address is selected by the switch circuit 6 and supplied to the predecoder/redundancy circuit 4. The X control circuit 7 outputs the redundancy non-access signal 102 and the activation signal 105 to the predecoder/redundancy circuit 4 in response to the internal refresh command 104. The predecoder/redundancy circuit 4 supplies a lower bit portion of the refresh address from the switch circuit 6 to the memory region 10 in response to the redundancy non-access signal 102 and the activation signal 105.

In the refreshing operation, all the BANKs 0 to 7 are activated. In this manner, the Y decoder YDEC 1 in each bank activates all the bit line pairs of the memory sub arrays to be refreshed. The X decoder XDEC 2 of each bank decodes the refresh address from the predecoder/redundancy circuit 4, and outputs the main word line selection signal MWLB and the sub word line selection signal FXB. These selection signals are supplied to each block in the bank.

Figure 10:
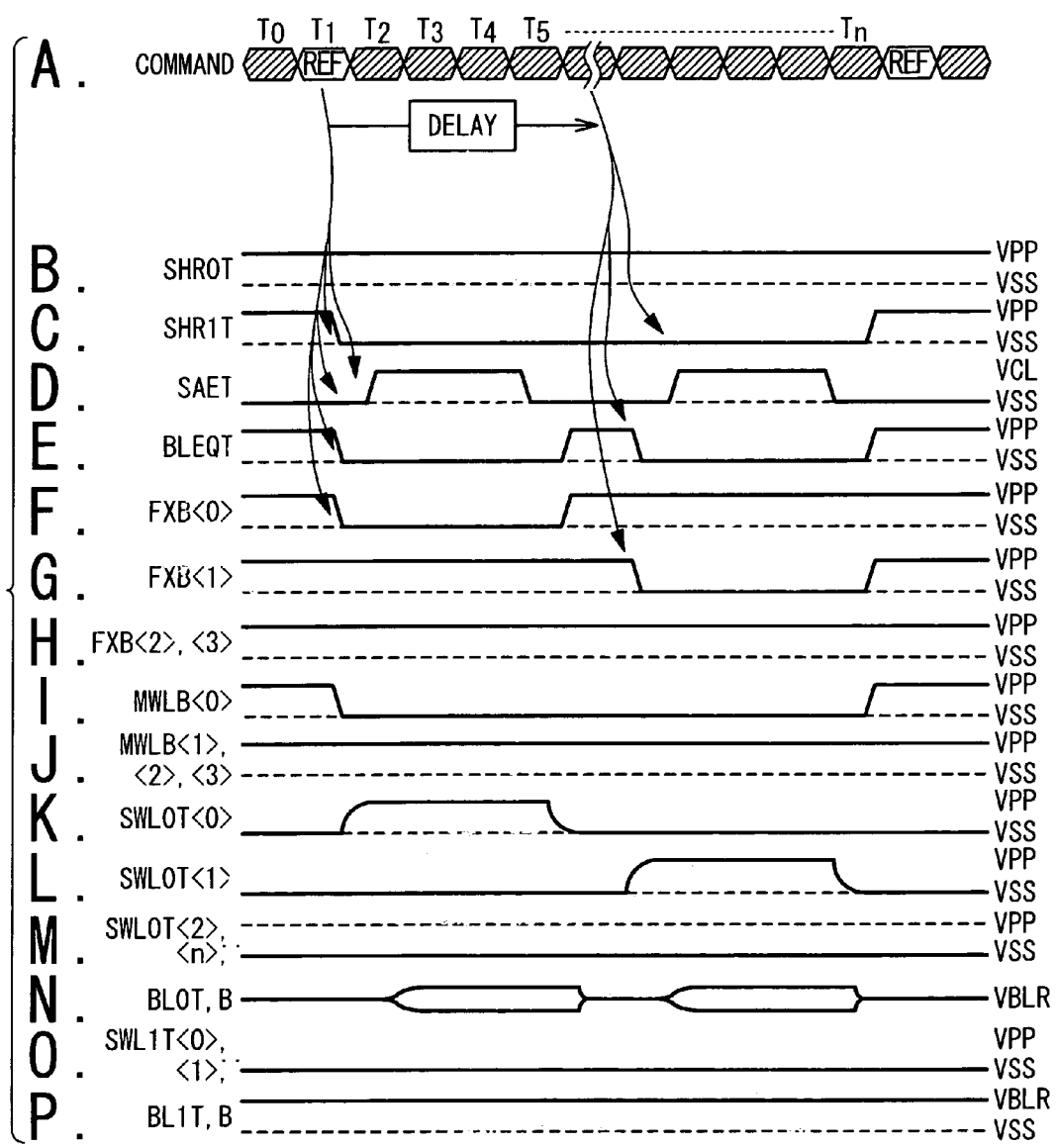
FIGS. 10A to 10P are timing chart showing the operation of the semiconductor memory device according to the first embodiment of the present invention.

Referring to FIGS. 10A to 10P, in the memory sub array pair shown in FIG. 6 specified based on the refresh address, the shared MOS transistors of the switching circuit 11-1 are turned on in response to the connection control signal SHR0T, and the memory sub array 3-1 is connected with the sense amplifier AMP and the equalizer EQ as shown in FIG. 10B. As shown in FIG. 10C, the memory sub array 3-2 is disconnected from the sense amplifier AMP and the equalizer EQ in response to the connection control signal SHR1T from the switching circuit 11-2. As shown in FIG. 10E, the potential of the equalizer control signal BLEQT is changed from the potential VPP to the potential VSS. The equalizer EQ carries out an equalizing operation when the potential of the signal BLEQT is in the potential VPP.

In this state, it is supposed that for example, the main word line selection signal MWLB <0> and the sub word line selection signal FXB <0> are negated, as shown in FIGS. 10F and 10I. Accordingly, the main word line selection signals MWLB <1>, <2>, and <3> remain in the potential VPP as shown in FIG. 10J and the sub word line selection signals FXB <2> and <3> remain in the potential VPP as shown in FIG. 10H. In this manner, the word line SWL0T <0> is selected by the sub word driver SWD <0> as shown in FIG. 10K. In the refreshing operation, the memory cells of memory sub array 3-1 connected to the word line SWL0T <0> of memory sub array 3-1 are accessed. Thus, data stored in the memory cell MC <0> are read out onto the bit lines BL0T/B.

In this case, as shown in FIG. 10D, the sense amplifier control signal SAET is activated so that the data on the bit lines are amplified. After a rewriting operation time (tRAS), the potential of the sense amplifier control signal SAET is changed from a potential VCL to the potential VSS. After the amplifying operation, the potential of the sub word selection signal FXB <0> is changed from the potential VSS to the potential VPP, and the potential of the equalizer control signal BLEQT is also changed from the potential VSS to the potential VPP. In this manner, the rewriting operation into the memory cells, i.e., the first refreshing operation is completed. Unlike from the conventional method, the connection control signal SHR1T and the word line selection signal MWLB <0> are not changed from the potential VSS to the potential VPP at the end of the first refreshing operation.

In this state, the refresh counter 5 counts the refresh address selection signal REFA from the X control circuit 7 and a new refresh address to each bank is selected by the switch circuit 6 and supplied to the memory region 10 through the predecoder/redundancy circuit 4. Therefore, the X decoder XDEC 2 does not negate the sub word line selection signal FXB <0> but negates the sub word line selection signal FXB <1>. In addition, the equalizer control signal BLEQT is activated, such that the bit lines BL0T/B are equalized.

Subsequently, the second refreshing operation is started. The second refreshing operation is started after the delay time corresponding to the delay time of the delay circuit D2 shown in FIG. 7 in response to the second refresh start signal REFS. The data of the memory cells to be refreshed secondly are amplified by the same sense amplifier as used for the first time. For this reason, the second refreshing operation can be started after a delay time as a summation of a time period (tRAS) during which the first refreshing operation is carried out to the memory cells and the time period (tRP) during which the bit lines BL0T/B are equalized to the same potential so that the sense amplifier becomes operable.

Next, the potential of the equalizer control signal BLEQT is changed from the potential VPP to the potential VSS for turning the equalizer EQ off, and the sub word line selection signal FXB <1> is selected and the potential thereof is changed from the potential VPP to the potential VSS. In this way, the potential of the word line SWL0T <1> is changed to the potential VPP. At this time, the potential of the sub word line selection signal FXB <0>, which is not selected, remains the potential VPP. The connection control signal SHR1T and the word line selection signal MWLB <0> remains the potential VPP after completion of the first refreshing operation. Therefore, no control is needed. Further, in a similar manner to the first refreshing operation, the connection control signal SHR0T remains the potential VPP. That is, in the present invention, although the refreshing operation is carried out twice in one refresh period, the average consumption current can be reduced in the refreshing operation.

Next, it is supposed that the main word line selection signal MWLB <0> and the sub word line selection signal FXB <1> are negated thereafter as shown in FIGS. 10G and 10I, like the first refreshing operation. The potentials of the main word line selection signals MWLB <1>, <2>, and <3> remain the potential VPP as shown in FIG. 10J, while the potentials of the sub word line selection signals FXB <2> and <3> remain the potential VPP as shown in FIG. 10H. In this manner, the word line SWL0T <1> is selected by the sub word driver SWD <1> as shown in FIG. 10L. In the refreshing operation, since all the bit line pairs in the memory sub array 3-1 are selected, the memory cells in the memory sub array 3-1 connected to the word line SWL0T <1> are accessed. Thus, the data stored in the memory cell MC <1> are read onto bit lines BL0T/B.

At this time, as shown in FIG. 10D, the sense amplifier control signal SAET is activated so that the data on the bit lines are amplified. After the rewriting operation time (tRAS), the potential of the sense amplifier control signal SAET is changed from the potential VCL to the potential VSS. After the amplifying operation, the potential of the sub word line selection signal FXB <1> is changed from the potential VSS to the potential VPP, and the equalizer control signal BLEQT is also changed from the potential VSS to the potential VPP. In this manner, the rewriting operation into memory cells, i.e., the second refreshing operation is completed. At this time, as shown in FIG. 10O, the potentials of the word lines SWL1T <0> and <2> in the memory sub array 3-2 remain the potential VDL, and as shown in FIG. 10P, the potentials of the bit lines BL1I/B remains the potential VBLR.

Figure 5A:
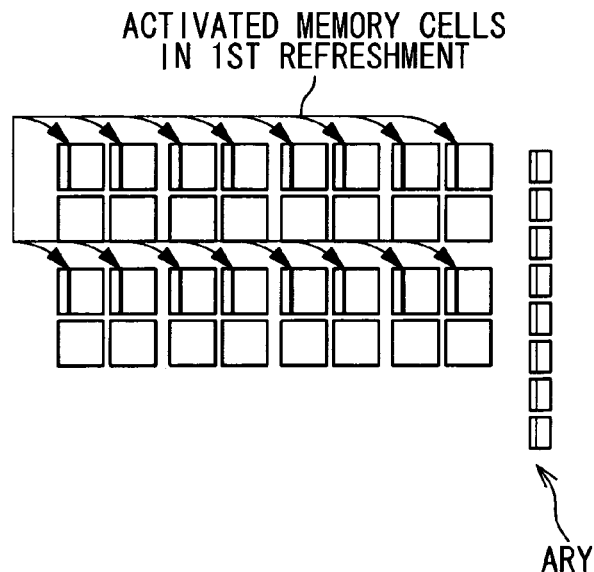
FIGS. 5A and 5B are diagram showing an order of a refreshing operation of the semiconductor memory device according to the first embodiment of the present invention.
Figure 5B:
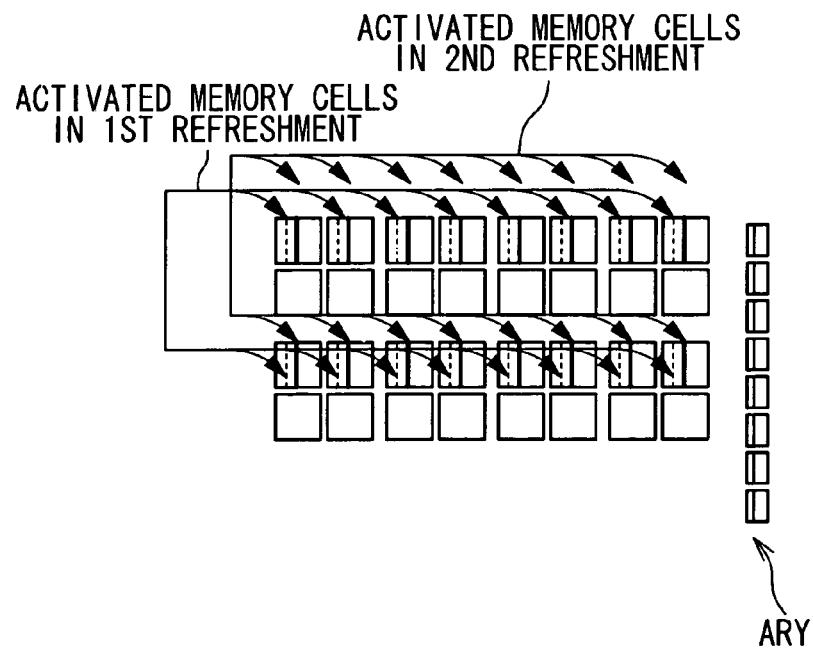

In this way, the refreshing operation is carried out twice in the period corresponding to the internal refresh command REF. The memory cells in the region shown in FIG. 5A are refreshed in the first refreshing operation, and then the memory cells in the region shown in FIG. 5B are refreshed in the second refreshing operation. The memory cells in the region shown in FIG. 5B are different from the memory cells shown in FIG. 5A, but belong to the same memory sub array (ARY) as the memory cells shown in FIG. 5A. The different memory cells on the same memory sub array mean the memory cells on the bit lines which share the shared MOS transistors (MOS transistor for connecting the bit line in the sense amplifier and the bit line on memory sub array) by the same sense amplifier. In such a refreshing operation, the connection control signal SHR0T is controlled such that the shared MOS transistors of the switching circuit 11-1 are turned on consistently during the first and second refreshing operations. In addition, the main word line selection signal MWLB <0> is also controlled to keep the selected state. In this way, the charge and discharge current due to the connection control signal SHR0T and the main word line selection signal MWLB <0> are eliminated.

Further, in the present invention, the first and second refreshing operations can be carried to each bank in time divisional manner as shown in FIGS. 9a to 9E. As a result, it is also effective in reducing the peak consumption current. For this purpose, the banks in the memory region 10 are divided into a plurality of groups. In this embodiment, the BANKs 0 to 7 are divided into four groups. The delay circuit D5 is inserted on the input side of the circuit section 9-3 of the control signal generating circuit 9 shown in FIG. 7. Although being not needed in the above operation, the delay circuit D5 is required in the following example. The circuit section 9-3 is provided for each of the groups. The delay time of the delay circuit D5 can be altered independently to each group. In this manner, it becomes possible to change the timing of generation of the control signals 1 and 2 and to carry out a plurality of the refreshing operations to the block groups in accordance with the internal refresh commands while changing the rewriting start timing as shown in FIGS. 9a to 9E. Thus, the present invention can reduce the peak current during the refreshing operation.

Hereinafter, the configuration of the semiconductor memory device according to the second embodiment of the present invention will be described. The basic configuration of the semiconductor memory device according to the second embodiment is the same as that of the first embodiment. The second embodiment is different from the first embodiment in that the refresh counter 5 counts the addresses specifying the main word line selection signal each time the refresh start signal REFS is inputted.

Next, the operation of the semiconductor memory device according to the second embodiment of the present invention will be described with reference to FIGS. 11A to 11P. In the first embodiment, a specific main word line selection signal and a specific sub word line selection signal are specified based on the refresh address in the first refreshing operation, and the specific main word line selection signal and a sub word line selection signal next to the specific sub word line selection signal are specified based on the next refresh address in the second refreshing operation. However, in the semiconductor memory device according to the second embodiment, a specific main word line selection signal and a specific sub word line selection signal are specified in the first refreshing operation, and a main word line selection signal next to the specific main word line selection signal is specified and the specific sub word line selection signal is not changed in the second refreshing operation. The other operations are the same as those shown in FIGS. 10A to 10P. The sub word line selection signal FXB corresponds to the selection of a lower bit of the row address in the hierarchy word line structure, but the main word line selection signal MWLB corresponds to the main word line selection signal of a bit of the higher address.

Figure 11:
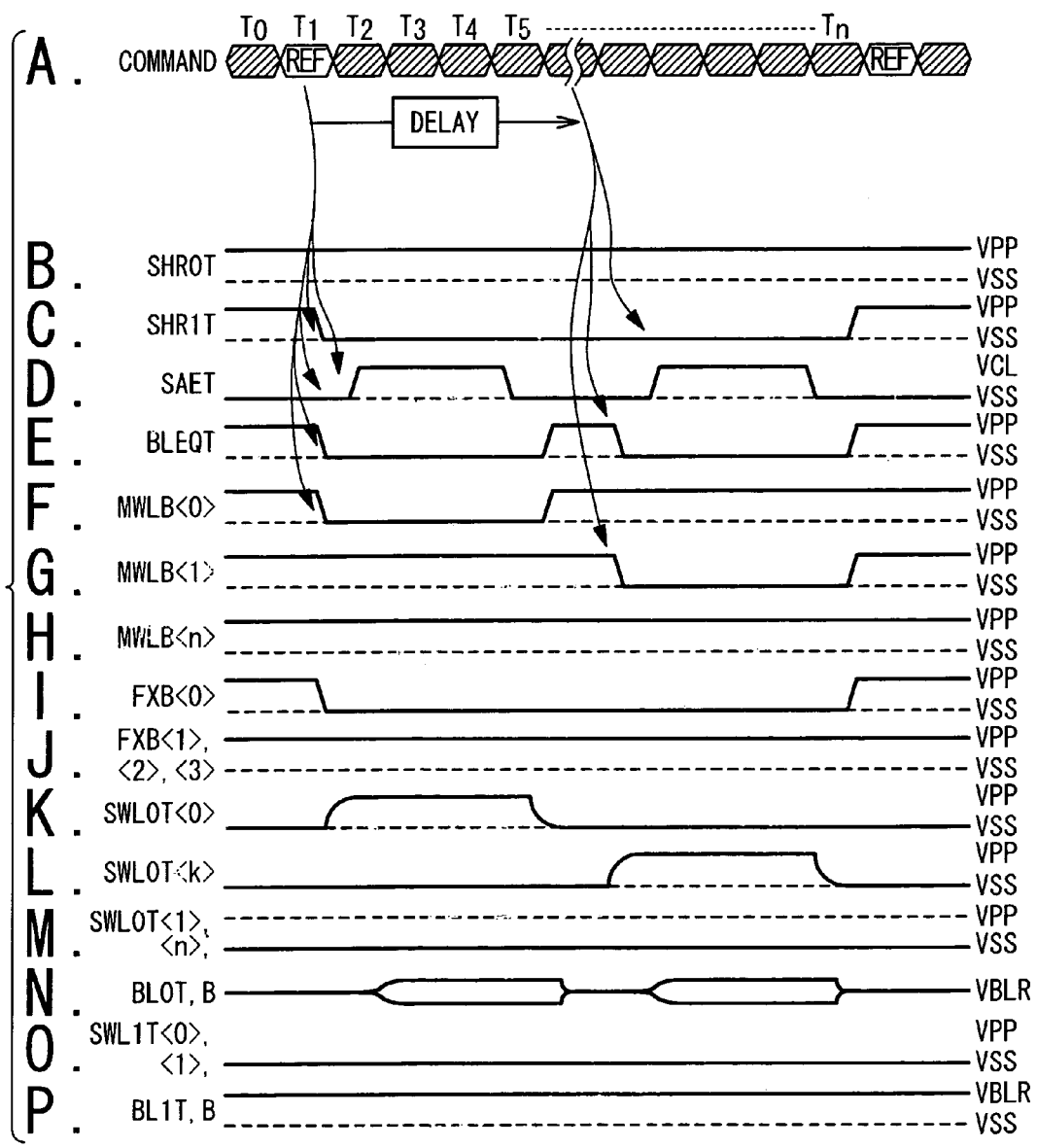
FIGS. 11A to 11P are timing charts showing the operation of the semiconductor memory device according to a second embodiment of the present invention.

At first, the first refreshing operation is started in response to the internal refresh command of FIG. 11A. The potentials of the connection control signal SHR1T and the equalizer control signal BLEQT are changed from the potential VPP to the potential VSS to turn off the shared MOS transistors of the switching circuits 11-2 in the inactivated memory sub arrays 3-2 in the BANK selected in the first refreshing operation and the equalizing circuits for equalizing the bit line potentials, as shown in FIGS. 11C and 11E. In order to turn on the shared MOS transistors of the switching circuit 11-1 in the activated memory sub array 3-1, the potential of the connection control signal SHR0T remains to be potential VPP as shown in FIG. 11B.

Next, as shown in FIGS. 11F and 11I, the main word line selection signal MWLB <0> and the sub word line selection signal FXB <0> are selected and the potentials thereof are changed from the potential VPP to the potential VSS. As shown in FIG. 11K, the potential of the word line SWLT <0> is changed to the potential VPP. As shown in FIG. 11N, when data are read out from the memory cell MC onto the bit lines BL0T/B, the potential of the sense amplifier control signal SAET is changed from the potential VSS to the potential VCL to start the amplification of the signals on the bit lines, as shown in FIG. 11D. After the signals on the bit lines are amplified sufficiently and the rewriting operation is completed, i.e., after the rewriting operation time (tRAS), the potential of the sense amplifier control signal SAET is changed from potential VCL to the potential VSS and the amplifying operation is completed, as shown in FIG. 1D. Subsequently, as shown in FIGS. 11E and 11F, the potentials of the equalizer control signal BLEQT and the word line selection signal MWLB <0> are changed from the potential VSS to the potential VPP, and the rewriting operation into the memory cells, i.e., the first refreshing operation is completed. Unlike the conventional method, the potentials of the connection control signals SHR1T and the sub word line selection signal FXB <0> are not changed from the potential VSS to the potential VPP in the end of the first refreshing operation.

The second refreshing operation is started in response to the refresh start signal REFS, after the delay time period corresponding to the delay time of the delay circuit D2 shown in FIG. 7. The memory cells to be refreshed secondly are amplified by the same sense amplifier as used in the first refreshing operation. In order to turn off the equalizing circuit after completion of the first refreshing operation, the potential of the equalizer control signal BLEQT is changed from the potential VPP to the potential VSS, and the word line selection signal MWLB <1> is selected and the potential thereof is changed from the potential VPP to the potential VSS as shown in FIGS. 11E and 11G. As shown in FIGS. 11F and 11L, the potential of the word line SWLT <1> is changed to the potential VPP. As shown in FIGS. 11C and 11L, the potentials of the connection control signal SHR1T and the word line selection signal FXB <0> for the memory sub array 3-2 remain the potential VPP after completion of the first refreshing operation. Accordingly, no control is needed. In a similar manner to the first refreshing operation, the potential of the connection control signal SHR0T remains potential VPP. As shown in FIG. 11N, when data are read from the memory cell MC onto the bit lines BL0T/B, the potential of the sense amplifier control signal SAET is changed from the potential VSS to the potential VCL, and the data on the bit lines are amplified. After the data is amplified, the potential of the sense amplifier control signal SAET is changed from the potential VCL to the potential VSS and the amplifying operation is completed as shown in FIG. 11D. Then, as shown in FIGS. 11C, E, G, and I, the potentials of the connection control signal SHR1T, the equalizer control signal BLEQT, main word line selection signal MWLB <1>, and the sub word line selection signal FXB <0> are respectively changed from the potential VSS to the potential VPP, and the rewriting operation on the memory cells, i.e., the second refreshing operation is completed.

In the above description, the difference between the first and second embodiments is in that the controls of the sub word line selection signal FXB <0> and the main word line selection signal MWLB signal are exchanged. The second embodiment can be accomplished by exchanging the connection for the main word line selection signal and the connection for the sub word line selection signal in the refresh counter 5. Thus, in the present invention, it is sufficient that the memory cells accessed in the first and second refreshing operations are selected by one of the sub word line selection signal FXB and the main word line selection signal MWLB which has smaller wiring load. Use of the selection signal decreases the wiring load and further reduces the current consumption in the first and second refreshing operations.

Figure 12:
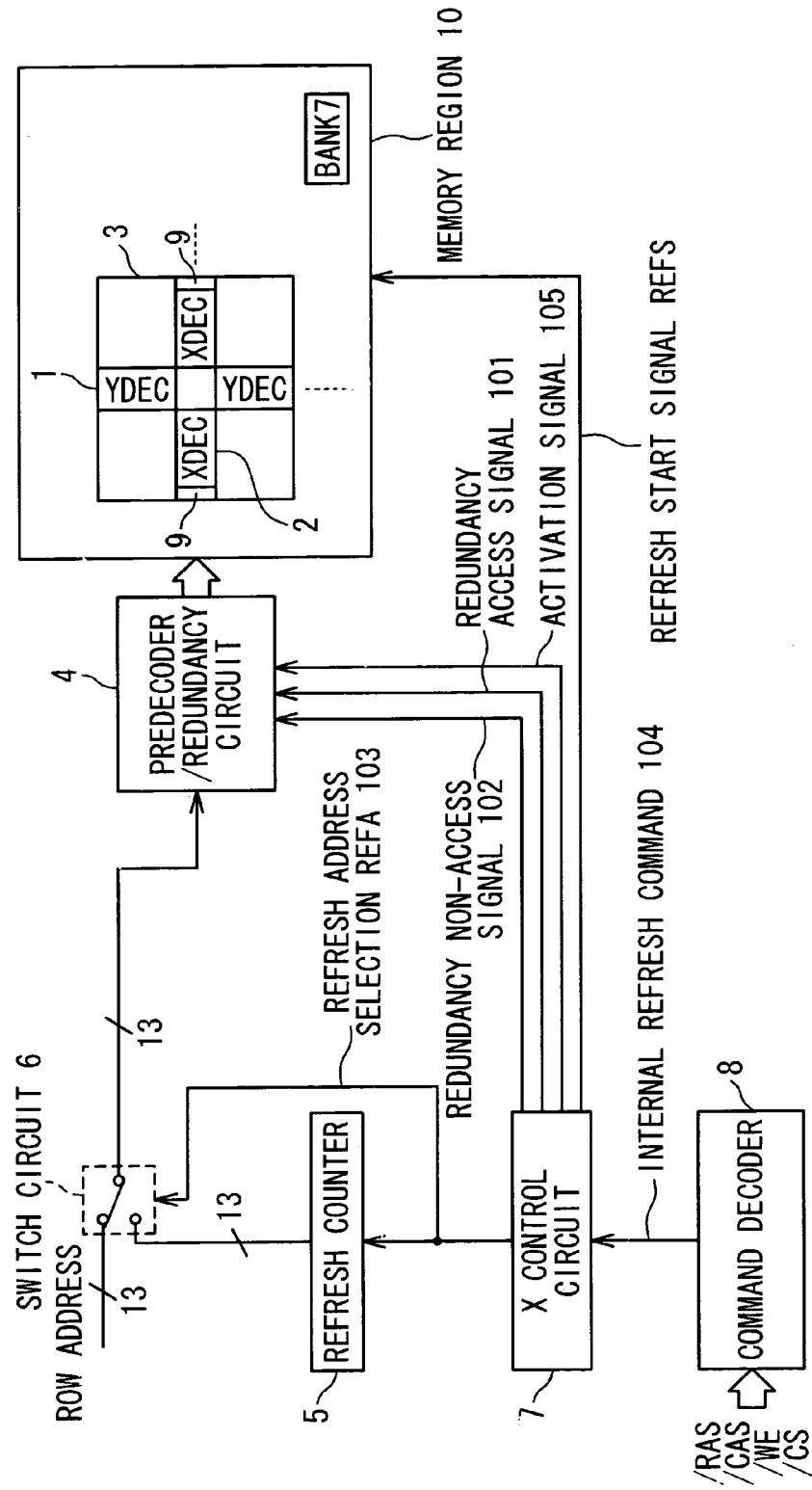
FIG. 12 is a block diagram showing a configuration of the semiconductor memory device according to a third embodiment of the present invention.

Hereinafter, the semiconductor memory device according to the third embodiment of the present invention will be described with reference to FIG. 12. In the semiconductor memory device according to third embodiment, the command decoder does not supply the internal reference command to the memory region 10. The circuit section 9-1 in the control signal generating circuit 9 is arranged in the X control circuit 7. In such a case, the circuit sections 9-2 and 9-3 other than the circuit section 9-1 in the control signal generating circuit 9 are arranged in each of the control signal generating circuits 9 in each bank. Accordingly, the refresh start signal REFS is supplied from the X control circuit 7 to each bank. The refresh address selection signal REFA is supplied from the X control circuit 7 to the refresh counter 5 and the switch circuit 6. In this manner, the semiconductor memory device operates in a similar manner to the first and second embodiments.

In this case, the circuit section 9-2 may be also arranged in the X control circuit 7 in a similar manner to the circuit section 9-1. In such a case, the control signal 1 is supplied from the X control circuit 7 to each control signal generating circuit 9 of the plurality of the banks.

Figure 13:
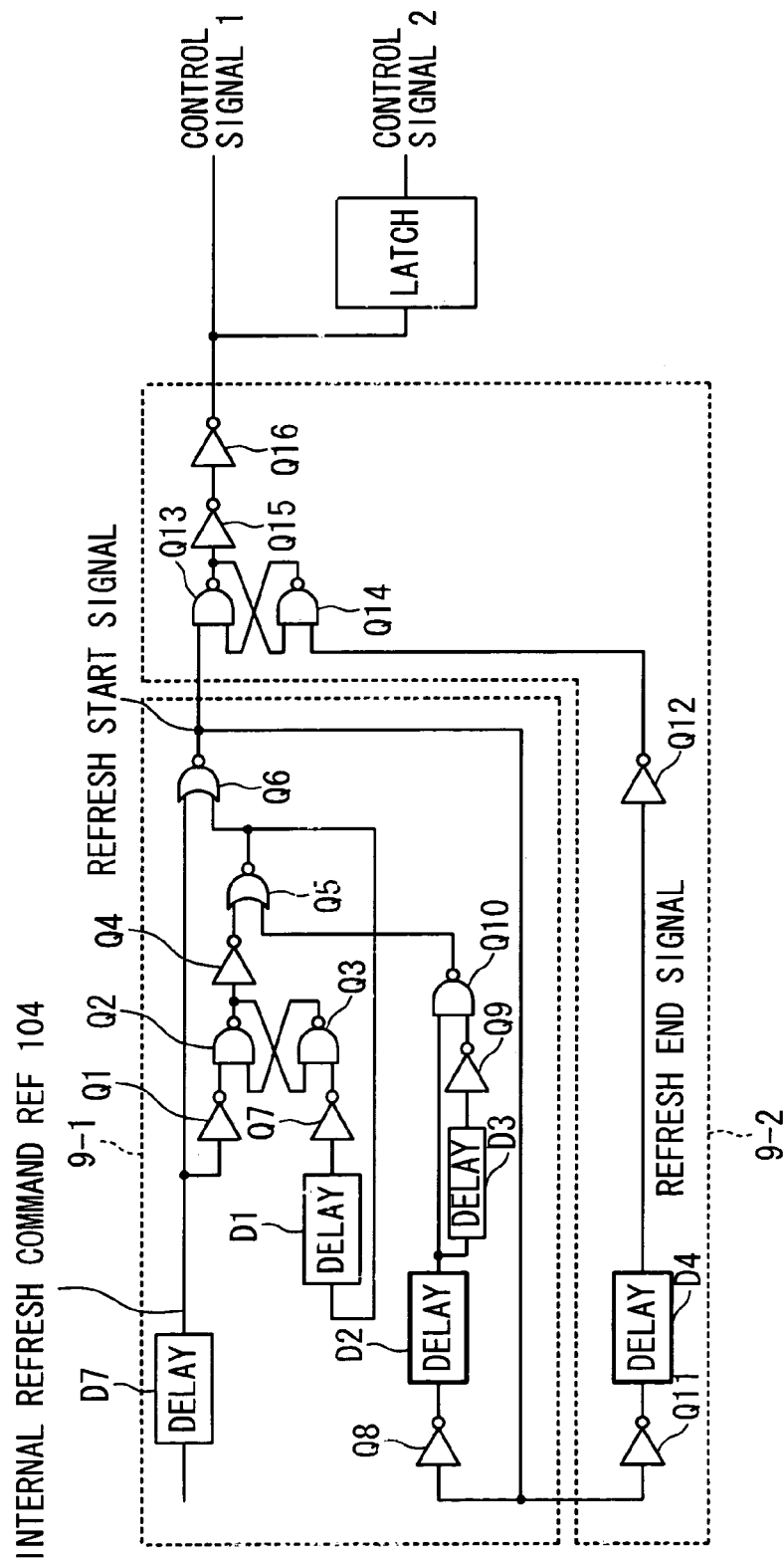
FIG. 13 is a block diagram showing a configuration of the control signal generating circuit in the semiconductor memory device according to a fourth embodiment of the present invention.

Next, the semiconductor memory device according to the fourth embodiment of the present invention will be described with reference to FIG. 13. In the semiconductor memory device according to the fourth embodiment, the delay circuit D5 of the control signal generating circuit 9 is eliminated, and the delay circuit D7 is interposed in the input side of the internal refresh command of the circuit section 9-1. At this time, if the plurality of blocks are grouped, the block groups can start twice of the refreshing operation at different timings by giving different delay times to the delay circuit D7 each block group. In this manner, the semiconductor memory device operates in a similar manner to the first and second embodiments. In addition, the average current consumption can be reduced.

Although being not particularly described in the above description, it could be apparent to a person in the art that it is possible to carry out the first and second refreshing operations to the redundant memory cells provided for each memory sub array or block in a similar manner to the normal memory cells by controlling the redundancy access signal 101.

What is claimed is:

1. A semiconductor memory device comprising:
   a pair of memory sub arrays, which share a sense amplifier, each of which has a plurality of memory cells arranged in a matrix, each of columns of the matrix being connected to a pair of bit lines, and each of rows of the matrix being connected to a word line; and
   a control signal generating circuit which sequentially outputs first and second refresh start signals within an operation time period corresponding to an external refresh command in response to an internal refresh command,
   wherein a first refreshing operation is carried out to first memory cells connected to a first word line of one of said memory sub arrays in response to said first refresh start signal and a second refreshing operation is carried out to second memory cells connected to a second word line different from said first word line in said memory sub array in response to said second refresh start signal.

2. The semiconductor memory device according to claim 1, wherein the pair of memory sub arrays further comprises:
   first and second switching circuits provided between said memory sub array and said sense amplifier to operate in response to first and second connection control signals, respectively; and
   an equalizer provided between said first and second switching circuits,
   wherein said control signal generating circuit outputs first and second sense amplifier control signals in response to said first and second refresh start signals, respectively, generates an equalizer control signal between said first and second sense amplifier control signals, and generates said first and second connection control signals to connect said memory sub array to said sense amplifier and said equalizer by said first switching circuit, and to disconnect the other memory sub array from said sense amplifier and said equalizer, and said sense amplifier is activated in response to each of said first and second sense amplifier control signals, and said equalizer is activated in response to said equalizer control signal.

3. The semiconductor memory device according to claim 1, further comprising:
an X decoder which outputs a first main word line selection signal and a first sub word line selection signal from first and second refresh addresses respectively supplied in response to said first and second refresh start signals to specify said first word line and a second main word line selection signal and a second sub word line selection signals from said first and second refresh addresses to specify said second word line,
wherein said first and second main word line selection signals are the same and said first and second sub word line selection signals are different from each other in said first and second refreshing operations.

4. The semiconductor memory device according claim 1, further comprising:
an X decoder which outputs a first main word line selection signal and a first sub word line selection signal from first and second refresh addresses respectively supplied in response to said first and second refresh start signals to specify said first word line and a second main word line selection signal and a second sub word line selection signals from said first and second refresh addresses to specify said second word line,
wherein said first and second main word line selection signals are different from each other and said first and second sub word line selection signals are the same in said first and second refreshing operations.

5. A semiconductor memory device comprising:
a memory region having a plurality of banks; and
a control signal generating circuit which sequentially outputs first and second refresh start signals in response to a single internal refresh command,
wherein each of said plurality of banks has a plurality of blocks, each of said plurality of blocks has a plurality of memory sub arrays, each of said plurality of the memory sub arrays has a plurality of memory cells arranged in a matrix, each of columns of said plurality of memory cells is connected to a pair of bit lines, and each of rows of said plurality of memory cells is connected to a word line,
said plurality of blocks in each of said plurality of banks are grouped into a plurality of block groups,
a refreshing operation is sequentially carried out to said plurality of memory sub arrays in each of said plurality of block groups of each of said plurality of banks based on the internal refresh command while changing a refresh address in response to each of said first and second refresh start signals to specify said memory cells to be refreshed, and then said refreshing operation is sequentially carried out to said plurality of memory sub arrays of remaining block groups.

6. The semiconductor memory device according to claim 5, wherein said plurality of banks are grouped into a plurality of bank groups, and
a start timing of said refreshing operation carried out in response to each of said first and second refresh start signals is different among said plurality of bank groups.

7. The semiconductor memory device according to claim 6, wherein said control signal generating circuit sequentially outputs said first and second refresh start signals within a refreshing operation time corresponding to said internal refresh command, and
said refreshing operation carried out to a specific one of said plurality of memory sub arrays of each of said plurality of block groups in response to said first refresh start signal and said refreshing operation carried out to said specific memory sub array in response to said second refresh start signal within said refreshing operation time of said internal refresh command.

8. The semiconductor memory device according to claim 5, wherein said plurality of memory sub arrays form a plurality of pairs,
each of said plurality of pairs comprises:
a sense amplifier;
first and second switching circuits provided between one of said plurality of memory sub arrays and said sense amplifier to operate in response to first and second connection control signals; and
an equalizer provided between said first and second switching circuits,
wherein said control signal generating circuit outputs first and second sense amplifier control signals in response to said first and second refresh start signals, respectively, generates an equalizer control signal between said first and second sense amplifier control signals, and generates said first and second connection control signals to connect said memory sub array to said sense amplifier and said equalizer by said first switching circuit, and to disconnect the other memory sub array from said sense amplifier and said equalizer, and
said sense amplifier is activated in response to each of said first and second sense amplifier control signals, and said equalizer is activated in response to said equalizer control signal.

9. The semiconductor memory device according to claim 5, further comprising:
an X decoder which outputs a first main word line selection signal and a first sub word line selection signal from first and second refresh addresses respectively supplied in response to said first and second refresh start signals to specify said first word line and a second main word line selection signal and a second sub word line selection signals from said first and second refresh addresses to specify said second word line,
wherein said first and second main word line selection signals are same and said first and second sub word line selection signals are different from each other in said first and second refreshing operations.

10. The semiconductor memory device according to claim 5, further comprising:
an X decoder which outputs a first main word line selection signal and a first sub word line selection signal from first and second refresh addresses respectively supplied in response to said first and second refresh start signals to specify said first word line and a second main word line selection signal and a second sub word line selection signals from said first and second refresh addresses to specify said second word line,
wherein said first and second main word line selection signals are different from each other and said first and second sub word line selection signals are same in said first and second refreshing operations.

11. A semiconductor memory device comprising:
two memory sub arrays sharing a sense amplifier, wherein said two memory sub arrays have a plurality of memory cells arranged in a matrix, and each of a plurality of the memory cells is specified by first and the second word line selection signals; and
a start control signal generating circuit which generates said first and second refresh start signals in response to a single refresh command,
wherein a refreshing operation is carried out to a memory cell portion of said plurality of memory cells in one of said two memory sub arrays in response to said first refresh start signal, and said refreshing operation is carried out to another memory cell portion of said plurality of memory cells different from said memory cell portion in said memory sub array in response to said second refresh start signal.

12. A semiconductor memory device comprising:
a memory region having a plurality of banks, each of said plurality of banks having a plurality of blocks, each of said plurality of blocks having a pair of memory sub arrays, said pair of memory sub arrays sharing a sense amplifier, and each of said memory sub arrays having a plurality of memory cells arranged in a matrix,
wherein a refreshing operation is carried out to specific memory cells of a plurality of specific blocks of said plurality of blocks in each of said plurality of banks within a first refresh time of a refresh time corresponding to a single external refresh command, and said refreshing operation is carried out to memory cells different from said specific memory cells of said plurality of specific blocks within a second refresh time after said first refresh time of said refresh time.

13. The semiconductor memory device according to claim 12, wherein said plurality of banks are grouped into a plurality of groups, and
a start timing of said refreshing operation to said plurality of specific blocks is different in units of groups.

14. A semiconductor memory device comprising:
a memory sub arrays connected with each other through a circuit region which includes a sense amplifier, an equalizer and first and second switching circuits;
a command decoder which decodes an external command to generate an internal refresh command;
a X control circuit which generates a refresh address selection signal twice during a time period corresponding to the external command;
a refresh counter which sequentially generates refresh addresses in response to said refresh address selection signal; and
a control signal generating circuit which generates control signals in response to said internal refresh command and controls said first and second switching circuit, said sense amplifier and said equalizer based on said control signals such that a refreshing operation is carried out twice to one of said memory sub arrays based on said refresh addresses and the other of said memory sub arrays is disconnected from said sense amplifier and said equalizer.

15. The semiconductor memory device according to claim 14, wherein said refresh counter generates said refresh address such that a first refreshing operation is carried out to a memory cell connected with a first main word line and a first sub word line and a second refreshing operation is carried out to a memory cell connected with a word line different from said first word line and said first sub word line.

16. The semiconductor memory device according to claim 14, wherein said refresh counter generates said refresh address such that a first refreshing operation is carried out to a memory cell connected with a first main word line and a first sub word line and a second refreshing operation is carried out to a memory cell connected with said first word line and a sub word different from said first sub word line.

17. The semiconductor memory device according to claim 14, wherein said control signal generating circuit comprises:
a first circuit section which generates control signals in response to said internal refresh command; and
a second circuit section which controls said first and second switching circuit, said sense amplifier and said equalizer based on said control signals,
said first circuit section is contained in said X control circuit.

* * * * *

UNITED STATES PATENT AND TRADEMARK OFFICE
CERTIFICATE OF CORRECTION

PATENT NO. : 7,082,072 B2  Page 1 of 1
APPLICATION NO. : 10/997320
DATED : July 25, 2006
INVENTOR(S) : Dono et al.

It is certified that error appears in the above-identified patent and that said Letters Patent is hereby corrected as shown below:

Claim 11, Col. 19, line 5, "first and the second word" should be --first and second word--.

Claim 11, Col. 19, line 7, "circuit which generates said first and second refresh start signals in response to a single refresh command" should be --circuit which sequentially generates first and second refresh start signals within an operation time period corresponding to an external refresh command in response to a single internal refresh command--.

Signed and Sealed this

Tenth Day of February, 2009

JOHN DOLL
*Acting Director of the United States Patent and Trademark Office*